United States Patent
Drobny

(10) Patent No.: US 8,435,873 B2
(45) Date of Patent: May 7, 2013

(54) UNGUARDED SCHOTTKY BARRIER DIODES WITH DIELECTRIC UNDERETCH AT SILICIDE INTERFACE

(75) Inventor: Vladimir Frank Drobny, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 142 days.

(21) Appl. No.: 11/757,767

(22) Filed: Jun. 4, 2007

(65) Prior Publication Data

US 2007/0287276 A1 Dec. 13, 2007

Related U.S. Application Data

(60) Provisional application No. 60/804,192, filed on Jun. 8, 2006, provisional application No. 60/804,195, filed on Jun. 8, 2006.

(51) Int. Cl.
*H01L 21/44* (2006.01)

(52) U.S. Cl.
USPC ............ 438/570; 438/72; 438/580; 438/758; 438/760; 257/296; 257/297; 257/E21.351; 257/E29.013

(58) Field of Classification Search .................. 257/260, 257/449–454
See application file for complete search history.

(56) References Cited

U.S. PATENT DOCUMENTS

| | | | |
|---|---|---|---|
| 3,906,540 A * | 9/1975 | Hollins | 257/476 |
| 3,906,620 A * | 9/1975 | Anzai et al. | 438/287 |
| 4,179,533 A * | 12/1979 | Christou et al. | 438/575 |
| 4,186,410 A * | 1/1980 | Cho et al. | 257/280 |
| 4,240,196 A * | 12/1980 | Jacobs et al. | 438/593 |
| 4,358,891 A * | 11/1982 | Roesner | 438/174 |
| 4,380,489 A * | 4/1983 | Beinvogl et al. | 438/710 |
| 4,397,079 A * | 8/1983 | Nagarajan et al. | 438/328 |
| 4,414,737 A * | 11/1983 | Menjo et al. | 438/564 |
| 4,619,887 A * | 10/1986 | Hooper et al. | 430/313 |
| 4,622,736 A * | 11/1986 | Drobny | 438/583 |
| 4,667,395 A * | 5/1987 | Ahlgren et al. | 438/514 |
| 4,691,435 A * | 9/1987 | Anantha et al. | 438/564 |
| 4,839,715 A * | 6/1989 | Gajda et al. | 257/751 |
| 4,851,369 A * | 7/1989 | Ellwanger et al. | 438/649 |
| 4,862,244 A * | 8/1989 | Yamagishi | 257/484 |
| 4,864,378 A * | 9/1989 | Tsaur | 257/451 |

(Continued)

OTHER PUBLICATIONS

"Relationship Between Junction Radius and Reverse Leakage of Silicide Schottky-Barrier Diodes", Vladimir F. Drobny, IEEE Transactions on Electron devices, vol. ED-31, No. 7, Jul. 1984, pp. 895-899.

(Continued)

*Primary Examiner* — N Drew Richards
*Assistant Examiner* — Ankush Singal
(74) *Attorney, Agent, or Firm* — Alan A. R. Cooper; Wade J. Brady, III; Frederick J. Telecky, Jr.

(57) ABSTRACT

One embodiment of the invention relates to an unguarded Schottky barrier diode. The diode includes a cathode that has a recessed region and a dielectric interface surface that laterally extends around a perimeter of the recessed region. The diode further includes an anode that conforms to the recessed region. A dielectric layer extends over the dielectric interface surface of the cathode and further extends over a portion of the anode near the perimeter. Other devices and methods are also disclosed.

8 Claims, 7 Drawing Sheets

U.S. PATENT DOCUMENTS

| | | | |
|---|---|---|---|
| 4,952,527 A * | 8/1990 | Calawa et al. | 438/167 |
| 5,137,840 A * | 8/1992 | Desilets et al. | 438/371 |
| 5,147,809 A * | 9/1992 | Won et al. | 438/367 |
| 5,258,640 A * | 11/1993 | Hsieh et al. | 257/471 |
| 5,326,718 A * | 7/1994 | Klose et al. | 438/504 |
| 5,332,627 A * | 7/1994 | Watanabe et al. | 428/426 |
| 5,354,716 A * | 10/1994 | Pors et al. | 438/396 |
| 5,438,218 A * | 8/1995 | Nakamura et al. | 257/452 |
| 5,550,069 A * | 8/1996 | Roth | 438/286 |
| 5,825,079 A * | 10/1998 | Metzler et al. | 257/653 |
| 5,895,248 A * | 4/1999 | De Boer et al. | 438/341 |
| 5,960,312 A * | 9/1999 | Morikawa | 438/624 |
| 5,994,753 A * | 11/1999 | Nitta | 257/471 |
| 6,027,991 A * | 2/2000 | Sasaki | 438/561 |
| 6,096,629 A * | 8/2000 | Tsai et al. | 438/570 |
| 6,323,525 B1 | 11/2001 | Noguchi et al. | 257/385 |
| 6,355,981 B1 * | 3/2002 | Richards et al. | 257/735 |
| 6,455,403 B1 * | 9/2002 | Hwang et al. | 438/576 |
| 6,790,753 B2 * | 9/2004 | Desko et al. | 438/578 |
| 6,864,535 B2 * | 3/2005 | Tihanyi | 257/349 |
| 6,872,964 B2 * | 3/2005 | Naberhuis et al. | 257/10 |
| 6,998,694 B2 * | 2/2006 | Wu | 257/471 |
| 7,002,187 B1 * | 2/2006 | Husher | 257/109 |
| 7,002,190 B1 * | 2/2006 | Geiss et al. | 257/197 |
| 7,071,503 B2 * | 7/2006 | Dohnke et al. | 257/256 |
| 7,112,918 B2 * | 9/2006 | Eden et al. | 313/356 |
| 7,151,035 B2 * | 12/2006 | Koshimizu et al. | 438/309 |
| 7,473,929 B2 * | 1/2009 | Kusumoto et al. | 257/77 |
| 7,732,842 B2 * | 6/2010 | Session | 257/284 |
| 7,880,228 B2 * | 2/2011 | Yasutake | 257/344 |
| 8,263,467 B2 * | 9/2012 | Grupp et al. | 438/299 |
| 2003/0087482 A1 * | 5/2003 | Hwang et al. | 438/167 |
| 2003/0137010 A1 * | 7/2003 | Friedrichs et al. | 257/355 |
| 2004/0089908 A1 * | 5/2004 | Desko et al. | 257/471 |
| 2004/0224464 A1 * | 11/2004 | Gonzalez et al. | 438/237 |
| 2005/0040489 A1 * | 2/2005 | Chuang et al. | 257/471 |
| 2005/0173739 A1 * | 8/2005 | Kusumoto et al. | 257/263 |
| 2006/0006477 A1 * | 1/2006 | Hashimi et al. | 257/382 |
| 2006/0008975 A1 * | 1/2006 | Gonzalez et al. | 438/237 |
| 2006/0022291 A1 | 2/2006 | Drobny et al. | |
| 2006/0028111 A1 * | 2/2006 | Park et al. | 313/311 |
| 2006/0076639 A1 * | 4/2006 | Lypen et al. | 257/471 |
| 2006/0131619 A1 * | 6/2006 | Wu | 257/260 |
| 2006/0138450 A1 * | 6/2006 | Lanois et al. | 257/109 |
| 2007/0052057 A1 | 3/2007 | Drobny | |
| 2009/0104762 A1 * | 4/2009 | Kusumoto et al. | 438/530 |

OTHER PUBLICATIONS

"Modeling Hot-Carrier Effects in Polysilicon Emitter Bipolar Transistors", J. David Burnett and Chenming Hu, IEEE Transactions on Electron Devices, vol. 35, No. 12, Dec. 1988, pp. 2238-2244.

* cited by examiner

UNGUARDED SCHOTTKY BARRIER DIODES WITH DIELECTRIC UNDERETCH AT SILICIDE INTERFACE

This application claims the benefit of U.S. Provisional Application Ser. No. 60/804,192, filed Jun. 8, 2006, entitled "Method for Making an Ideal PtSi Unguarded Schottky Barrier Diode," and U.S. Provisional Application Ser. No. 60/804,195, filed Jun. 8, 2006, entitled "Method for Suppression of Hot Carrier Damage in Unguarded Schottky Barrier Diodes"; both of which are incorporated herein by reference in their entireties.

BACKGROUND

The invention relates generally to semiconductor devices and more particularly to unguarded Schottky barrier diodes.

A diode is an electrical component that allows current to flow in one direction, but not in the other. FIG. 1 is a circuit symbol of a typical Schottky barrier diode 100, where the diode 100 has an anode 102 (metal) in direct contact with a cathode 104 (n-type doped semiconductor material). In Schottky barrier diodes, conventional current can typically flow from the anode 102 to the cathode 104, but not from the cathode to the anode. Schottky barrier diodes typically result in fast switching times and low forward voltage drop, relative to conventional p-n diodes.

Schottky barrier diodes are available in guarded and unguarded diode configurations. Guarded Schottky barrier diodes include a p-n junction guard ring disposed in the substrate around the perimeter of the diode. Although the p-n junction guard ring eliminates some adverse leakage current effects around the perimeter, at higher forward bias (especially for high barrier height silicides) there is significant injection of minority carriers. This injection leads to very slow diode recovery after the forward bias is removed. This phenomenon cannot be tolerated in many high speed applications.

Therefore, many high speed applications require integrated unguarded Schottky barrier diodes to be able to operate at high reverse bias voltages while offering very fast recovery speeds. For some time, however, these diodes have suffered from hot carrier damage even after a modest reverse bias of 10-15 volts or less. This hot carrier damage can lead to unguarded Schottky barrier diodes with non-ideal I-V characteristics. Accordingly, there is a need for improved unguarded Schottky barrier diodes and manufacturing techniques.

SUMMARY

One embodiment of the invention relates to an unguarded Schottky barrier diode. The diode includes a cathode comprising a recessed region and a dielectric interface surface that extends laterally around a perimeter of the recessed region. A silicide layer at least substantially conforms to the recessed region. The diode also includes a dielectric layer having a window with sidewalls that are near the perimeter of the recessed region, and the dielectric layer extends continuously over the dielectric interface surface and at least a portion of the silicide layer near the perimeter of the recessed region.

DETAILED DESCRIPTION OF EXAMPLE EMBODIMENTS

Figure 1:
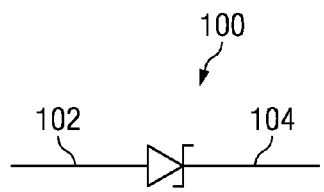
FIG. 1 (Prior Art) shows a conventional circuit symbol for a Schottky barrier diode.
Figure 2:
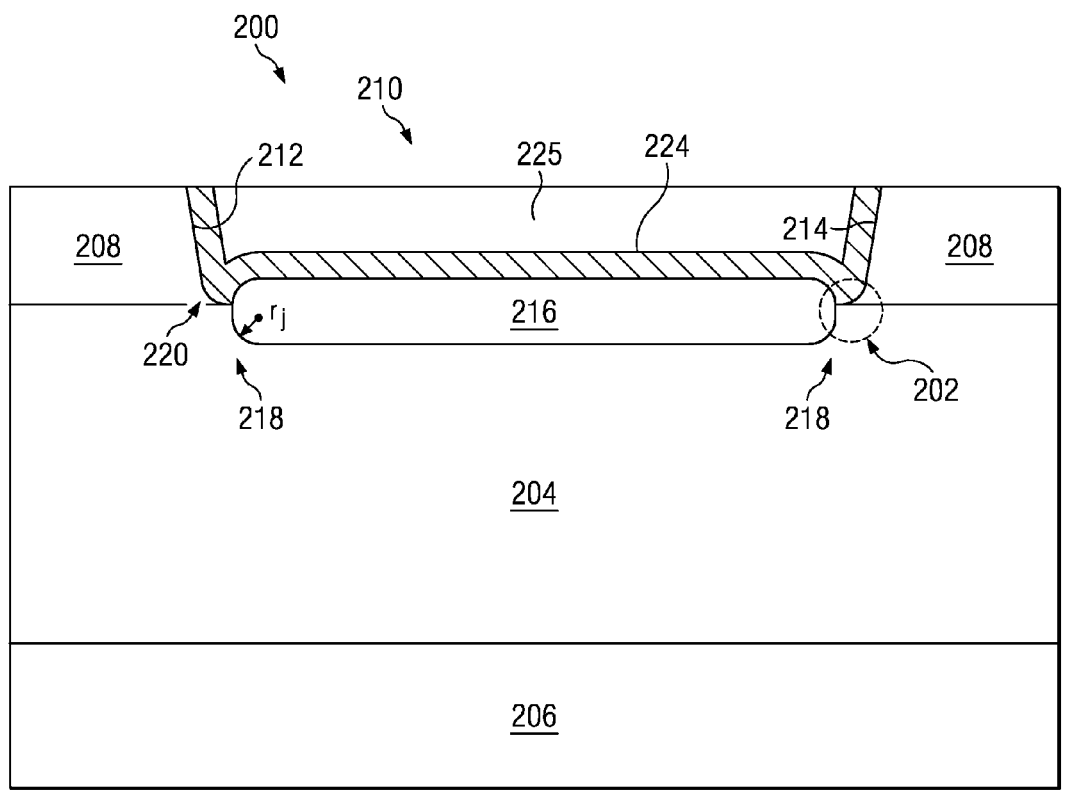
FIG. 2 (Prior Art) shows a conventional Schottky barrier diode that may suffer from leakage current through a metal insulator diode.

Aspects of this invention are aimed at preventing formation of a leaky metal insulator semiconductor (MIS) parasitic diode at the Schottky barrier diode perimeter. A more detailed description of this problem is now discussed with reference to FIG. 2, which shows an unguarded Schottky barrier diode 200 having a leaky, low-barrier height MIS diode 202 at its perimeter. In essence, the MIS diode 202 allows current to "leak" through or around the diode, which causes the overall diode characteristics to significantly deviate from those of an ideal diode.

Briefly, the diode 200 includes a lightly doped n-type silicon region cathode 204 under which a buried layer 206 (cathode contact) resides. A dielectric layer 208 is formed over the cathode 204, and a window 210 opening with tapered sidewalls 212, 214 is formed within the dielectric layer 208. A silicide layer 216 is formed in direct contact with the cathode 204 and is directly adjacent to the bottom of the tapered sidewalls 212, 214. A titanium-based (Ti-based) diffusion barrier metal layer 224 (or other refractory metal) is typically formed over the silicide layer 216, and filler metal 225 is deposited over the diffusion barrier metal layer 224.

The parasitic MIS diode 202 is formed at a perimeter 218 of the Schottky barrier diode (i.e., near the bottom of the tapered sidewalls 212, 214 of the dielectric). More particularly, the MIS diode 202 exists where a thin dielectric tail 220 is sandwiched between the diffusion barrier metal 224 and the cathode 204. Ideally, during operation, all current would flow directly between the cathode 204 and anode 216 of the diode, and not through the MIS diode 202. However, the inventors have appreciated that a sufficiently thin dielectric tail 220 allows the MIS diode 202 to conduct a significant amount of current by tunneling. This leakage current, combined with the current flowing through the anode 216 causes the Schottky barrier diode 200 to have non-ideal I-V characteristics.

Moreover, this parasitic leakage current from the MIS diode is highly variable and difficult to control. This results in poor manufacturing repeatability and poor device to device matching. Thus, diode 200 is not generally usable in high precision circuits unless the problem with the formation of the MIS diode can be prevented. Note that the MIS diode dominates the forward bias characteristics only at lower bias voltages because its high series resistance limits its current at higher forward bias voltages (i.e., the cathode 204 and anode 216 of the Schottky barrier diode have a low series resistance that does not limit the current flow at higher bias voltages).

Other aspects of this invention are aimed at suppressing hot carrier damage at the perimeter 218 of unguarded Schottky barrier diodes. Hot carrier damage can occur when charged carriers (electrons or holes) are accelerated by a high electric field present at the perimeter 218 of the diode 200. These hot carriers are injected into the dielectric 208, and damage the dielectric/silicon interface by generating charged trapping centers. Note that the electric field at the perimeter of the diode is described by the following equation:

$$E(r_j) = -\frac{qN_D}{2\varepsilon_s}\left(\frac{r_w^2 - r_j^2}{r_j}\right) \quad (1)$$

where E is the electric field, $r_w$ is the radius of the depletion layer edge and $r_j$ is the radius of the anode/cathode junction at the perimeter. Equation 1 shows that the electric field is inversely proportional to the radius $r_j$.

Another element contributing to hot carrier damage is the oxide/silicon interface at the diode's perimeter (i.e., the location where hot carriers can inflict damage by creating positively charged trapping centers). The density of these charge centers is a linearly dependent function of the perimeter current and time. This charge enhances the carrier concentration at the perimeter of an n-type substrate and reduces the carrier concentration of a p-type substrate. Increase in the effective doping concentration further increases the electric field, as described in Equation 1, by increasing $N_D$ in this example for an n-type silicon substrate. The effective Schottky barrier height is reduced by the barrier lowering terms below, $$\Phi_B^* = \Phi_{B0} - \alpha E - \sqrt{\frac{qE}{4\pi\varepsilon_s}} \quad (2)$$

where $\Phi_{B0}$ is the intrinsic barrier height, and $\alpha$ is the tunneling coefficient ($\alpha$=3 nm for PtSi). Increase in the electric field, caused by the localized increase in the carrier concentration, results in a drop of the effective Schottky barrier height at the perimeter after the reverse bias stress damage occurs. This explains why there is an increase in the reverse current after subjecting the diode to a significant reverse bias stress. The opposite effect (i.e., decrease in reverse current) is observed in diodes with a p-type silicon substrate where the localized carrier concentration decreases after the stress.

Figure 3A:
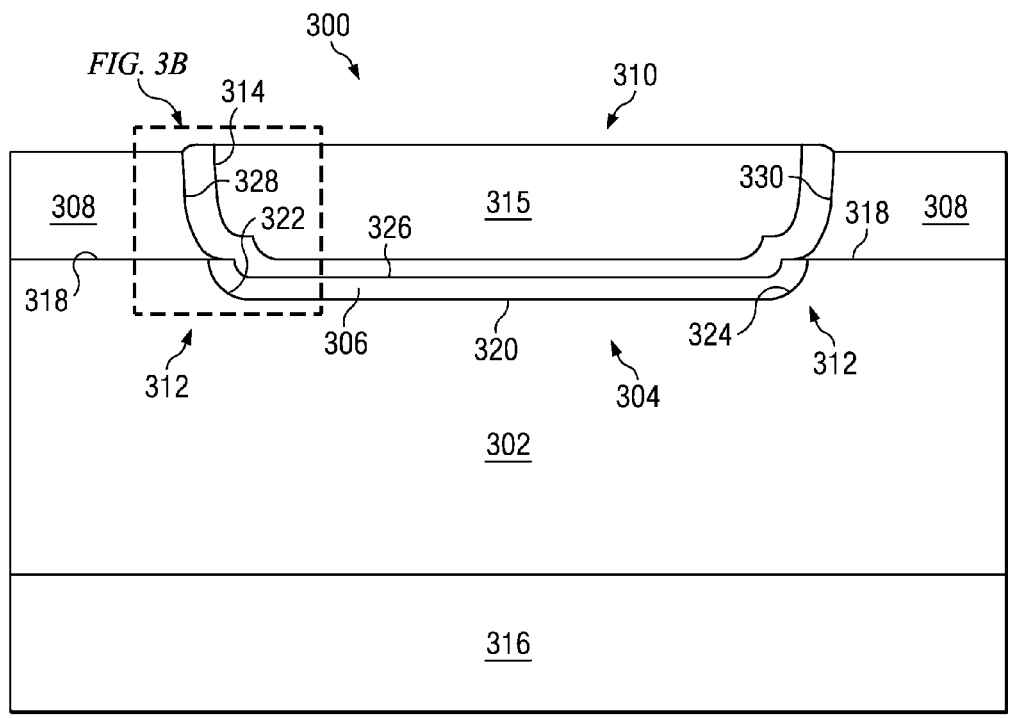
FIGS. 3A-3B show an unguarded Schottky barrier diode that may mitigate formation of a metal insulator diode at its perimeter.
Figure 3B:
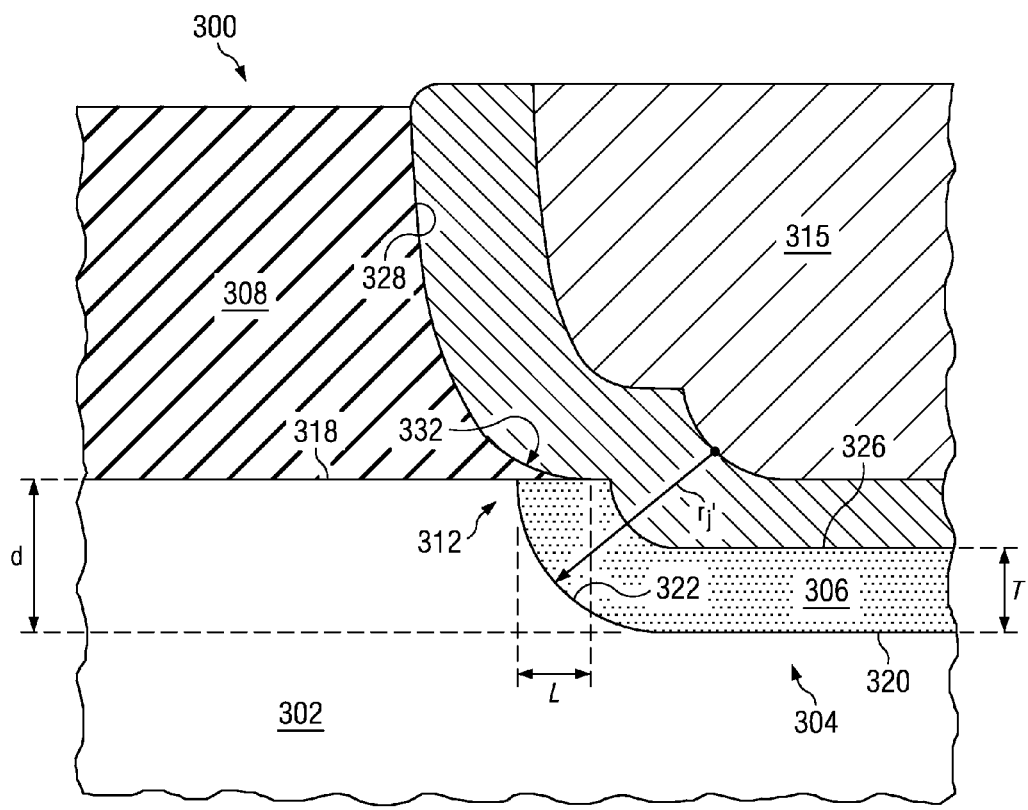

Therefore, aspects of the invention aim to prevent the formation of the MIS diode and to suppress hot carrier damage at the perimeter of the Schottky barrier diode. FIGS. 3A-3B show an example of an unguarded Schottky barrier diode 300 that may achieve these ends.

The diode 300 of FIGS. 3A-3B includes a cathode 302 having a recessed region 304 over which a silicide layer 306 is formed. A dielectric layer 308 having a window 310 therein overlies the cathode 302. To prevent the formation of an MIS diode, the silicide layer 306 is formed to undercut a portion of the dielectric layer 308 near a perimeter 312 of the recessed region 304. A diffusion barrier metal 314 (e.g., a Ti-based diffusion barrier metal or other similar refractory metal) may be formed over the silicide layer, and the remainder of the opening of window 310 may be filled with a high conductivity filler metal 315. In effect, by providing a silicide layer 306 that undercuts the dielectric layer 308, the diode 300 has significantly thick isolation between the barrier diffusion metal 314 and the cathode 302, such that current tunneling (and, thus, unwanted parasitic leakage) will not occur. In addition, because the silicide layer 306 undercuts the dielectric 308, the diode 300 has an increased anode/cathode junction radius $r_j'$ (compared to radius $r_j$ of diode 220), which reduces the electric field carriers experience, thereby limiting hot carrier damage.

As shown in FIG. 3A, the cathode 302 typically overlies a highly conductive buried layer 316 (such as, e.g., a highly doped n-type region of the silicon substrate) that serves as a cathode contact.

The cathode 302, which may be a lightly doped n-type region of the silicon substrate, includes a dielectric interface surface 318 that extends laterally around the perimeter 312 of the recessed region 304. The recessed region 304 may have a recessed surface 320 and concave sidewalls 322, 324.

The silicide layer 306 may substantially conform to the recessed region 304 and, depending on the implementation, the silicide layer 306 may have various thicknesses. For example, in the illustrated embodiment, the silicide thickness T is such that a top silicide surface 326 is positioned between the dielectric interface surface 318 and the recessed surface 320. However, depending on the silicide layer thickness T and the depth d of the recessed region, the top silicide surface 326 could also be above the dielectric interface surface 318.

The dielectric layer 308 can be characterized by a window 310 opening or aperture in the dielectric layer, which has sidewalls 328, 330 that are near the perimeter 312 of the recessed region. In the illustrated embodiment, the sidewalls are generally concave, although they could be convex or substantially vertical in other embodiments. These sidewalls may cause the dielectric layer to include a tail 332 (FIG. 3B), which is a thin region of the dielectric sandwiched between the barrier diffusion metal 314 and the silicide layer 306. The extent by which the recessed region must undercut the tail 332 (length L) may be a function of the reverse bias the diode is to withstand. As the reverse bias the diode is to withstand increases, a designer may increase the length L, depth d, and/or the thickness T of the silicide layer 306. In effect, by increasing the length L, depth d, and/or thickness T, the designer is providing greater isolation between the barrier diffusion metal 314 and the cathode 302, such that unwanted parasitic leakage will not occur. The same is also increasing the effective anode/cathode radius (from $r_j$ in FIG. 2 to $r_j'$ in FIG. 3B) and, thus, decreasing the electric field as described by Equation 1. For example, in one embodiment where the diode is to withstand a reverse bias of approximately 20 V, the recessed region undercuts the dielectric by a length L of approximately 10-100 nm. In various embodiments, the silicide layer may have a thickness T of approximately 10-100 nm.

Example methods for manufacturing such Schottky barrier diodes are described with reference to a general method 400 illustrated in FIG. 4 and with reference to more detailed steps of a method 500 illustrated in FIGS. 5-12. It will be appreciated that the ordering of steps is not limited by the illustrated ordering and that some acts or events may occur in different orders than illustrated and/or concurrently with other acts or events including acts or events apart from those illustrated and/or described herein. In addition, not all illustrated steps may be required to implement a methodology in accordance with one or more aspects or embodiments of the invention. Further, one or more of the acts depicted herein may be carried out in one or more separate acts and/or phases.

Figure 4:
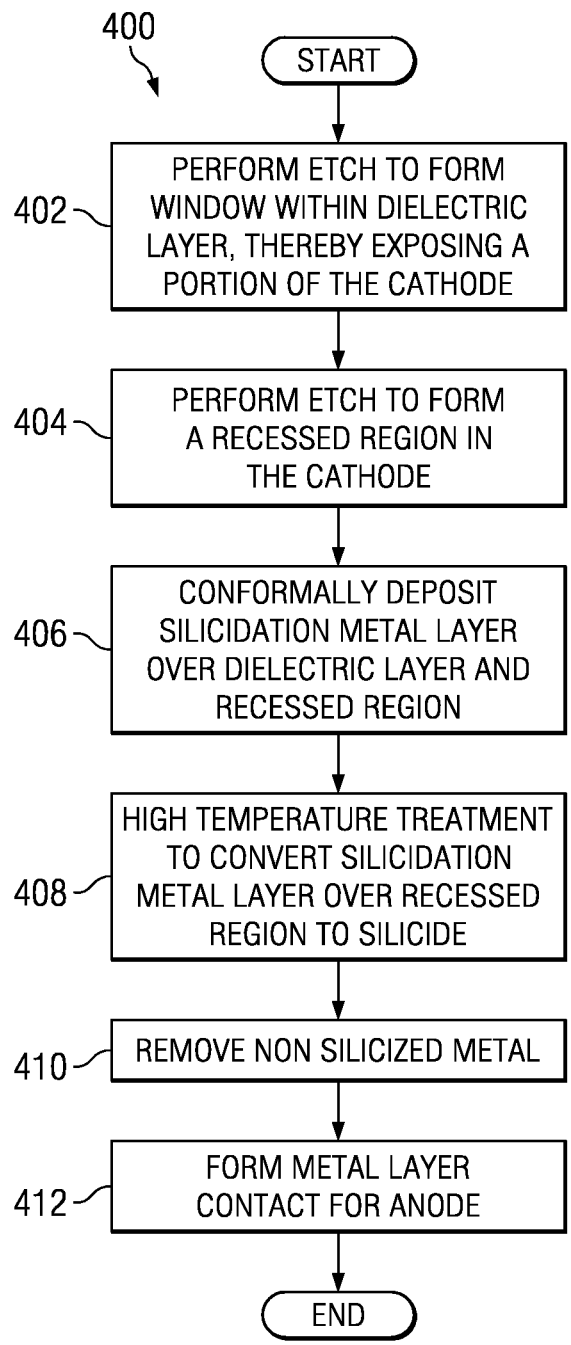
FIG. 4 shows a somewhat general method of forming an unguarded Schottky barrier diode.

As shown in FIG. 4, method 400 starts with providing a dielectric layer overlying a cathode in a semiconductor substrate. At 402, a window opening is etched into the dielectric layer, thereby exposing a portion of the cathode. In 404, an etch is performed to form a recessed region in the cathode. In various embodiments, blocks 402 and 404 may be performed in a single etch that results in a significant isotropic overetch at the perimeter of the diode. This overetch creates a silicon profile with a junction radius much larger than created by prior art processes. Thus, this etch leads to an unguarded Schottky barrier diode with significantly reduced electric field (relative to prior art processes), which can suppress the onset of the reverse bias induced hot carrier damage until much higher bias voltages are applied. After the recessed region is formed, in 406 a metal that is used in silicide formation is conformally deposited over the recessed region. In 408, the metal layer in the recessed region is converted to a metal silicide using a high temperature treatment. In 410, the non-silicided metal is removed. Lastly, in 412, a metal layer contact for the anode is formed.

More detailed steps in an example method 500 are described with reference to FIGS. 5-12, which show cross-sectional views of various stages in the manufacture of an embodiment of an unguarded Schottky barrier diode.

Figure 5:
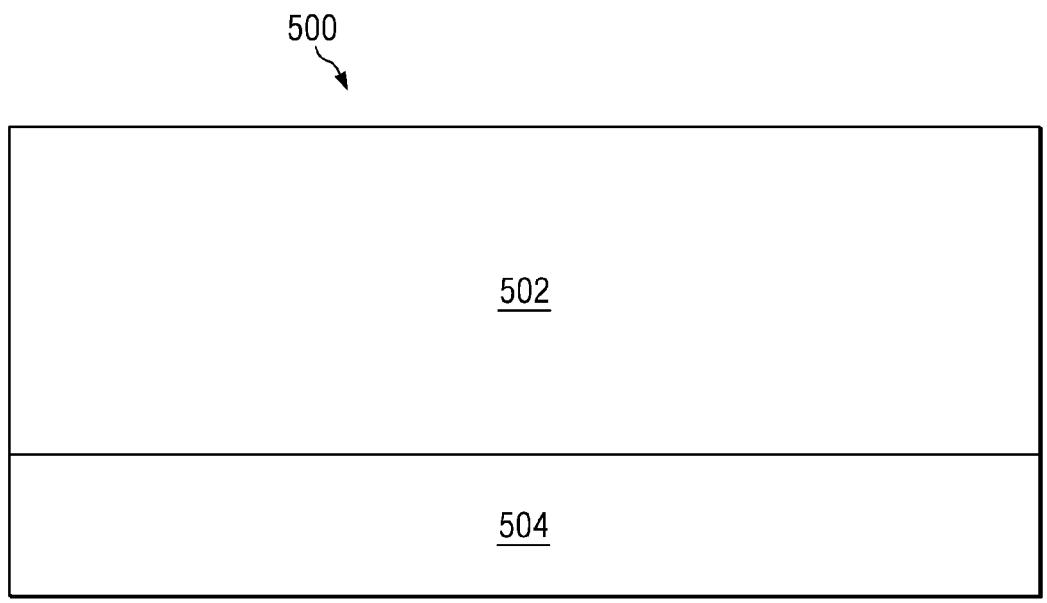
FIGS. 5-12 show cross-sectional views of stages in a more detailed method of forming an unguarded Schottky barrier diode.

In FIG. 5, a lightly doped silicon region cathode 502 is formed over a highly doped silicon buried layer 504. The highly doped buried layer 504 may be formed, for example, by implanting a high dopant concentration of n-type impurities into a silicon substrate. This can be followed by an epitaxial growth of silicon to form the lightly doped silicon layer 502 cathode region.

Figure 6:
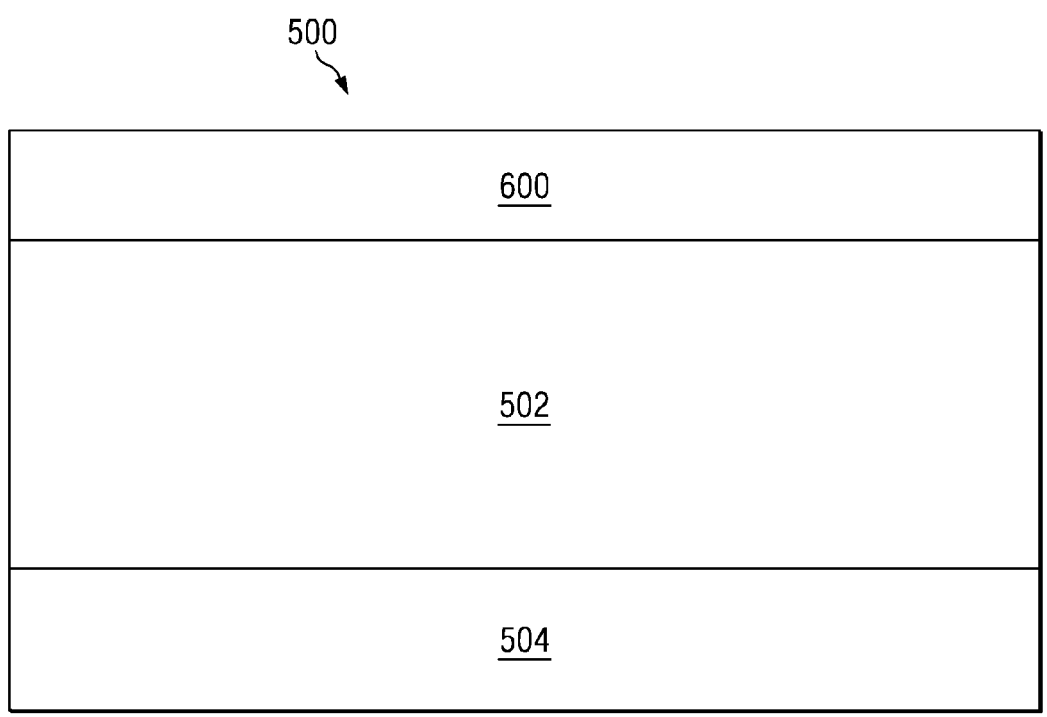

In FIG. 6, a dielectric layer 600 is formed over the lightly doped silicon cathode 502. In various embodiments, the dielectric layer 600 may comprise a single layer or some combination of thermally grown $SiO_2$, deposited $SiO_2$, silicon nitride or another suitable dielectric. In various embodiments, the dielectric layer may include spacers or not, and/or may comprise a single solid material (e.g., field oxide or other continuous material).

Figure 7:
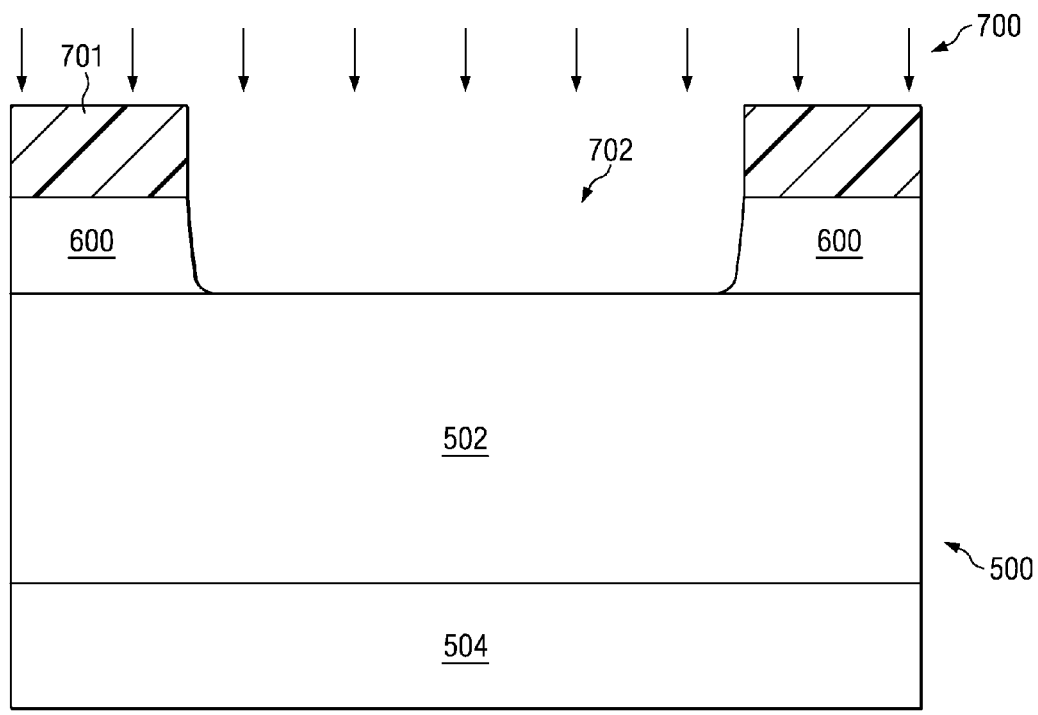
Figure 8:
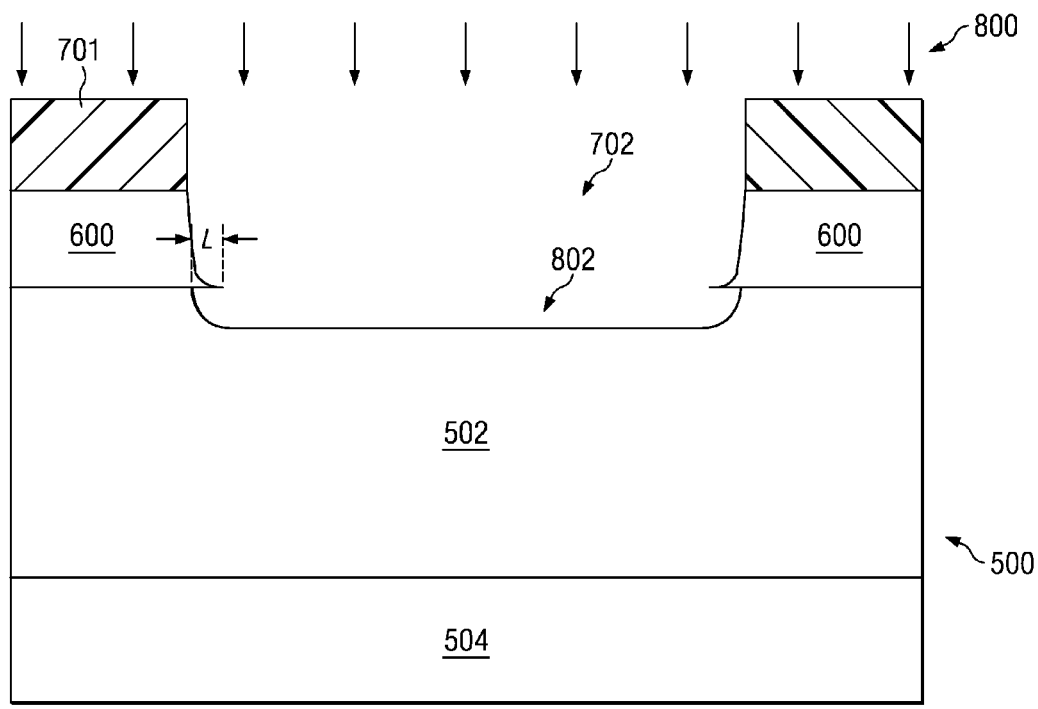

In FIG. 7, once the dielectric layer 600 has been formed, a mask 701 (such as photoresist or a hard mask) is formed over the dielectric layer, and an etch 700 is performed to form a window 702 opening in the dielectric layer 600 through which a portion of the cathode is exposed. In some embodiments, etch 700 may be an isotropic (multidirectional) etch, such as a wet or plasma etch, that results in concave sidewalls. In other embodiments, etch 700 may be an anisotropic (unidirectional) etch, such as a plasma (RIE) etch, that results in relatively vertical sidewalls. In FIG. 8, an etch 800 is performed to form a recessed region 802 within the cathode 502. This etch 800 is typically an isotropic etch that is selective between the silicon cathode and the dielectric layer, thereby removing a portion of the cathode and undercutting the dielectric layer by length L.

In some embodiments, etches 700 and 800 could be carried out as separate etches. In other embodiments, etches 700 and 800 may be performed as a single etch, where the semiconductor structure is kept within the etch tool and not exposed to the laboratory environment. Many different single or sequential etches having different material selectivities and etch rates may accomplish similar end results. The selection of a particular etch technique depends upon fabrication capability, cost and convenience.

Figure 9:
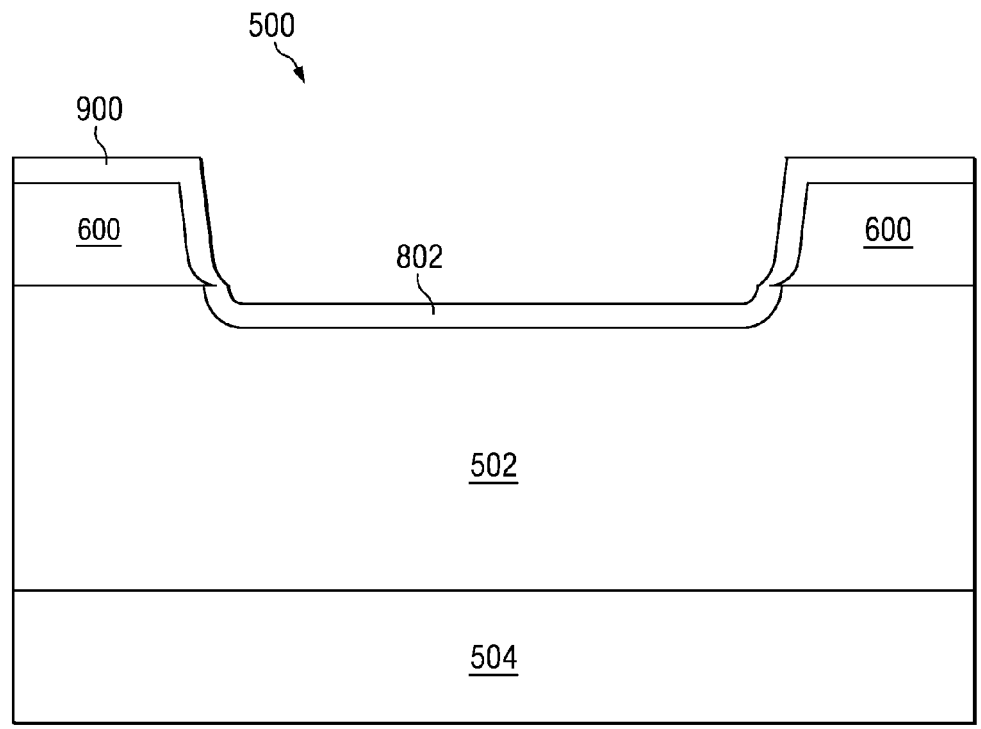

In FIG. 9, the mask 701 has been removed and a silicidation metal 900 has been conformally deposited over the dielectric layer 600 and the recessed region 802. This silicidation metal 900 may be deposited, for example by a sputtering process, evaporation, CVD or any other suitable technique. In one embodiment, the silicidation metal could be platinum (Pt), palladium (Pd) or cobalt (Co), although any other suitable metal could be used.

Figure 10:
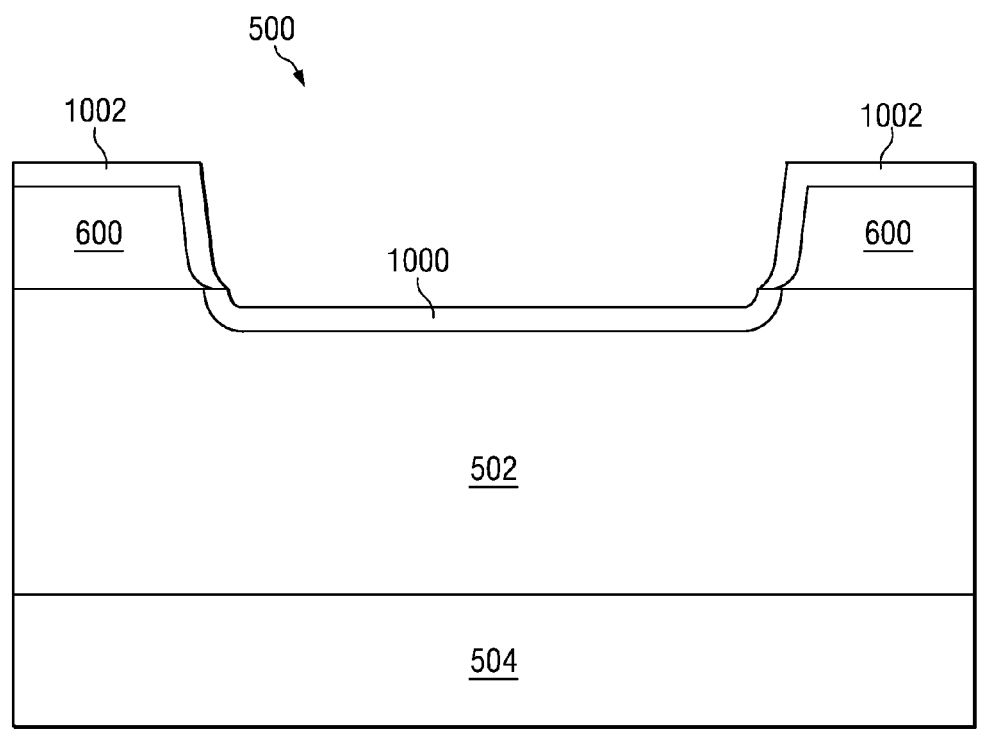

In FIG. 10, the structure is exposed to one or more high temperature treatments to convert the silicidation metal 900 that contacts the cathode to a silicide. As shown, the deposited silicidation metal 900 has now been converted to a silicided metal layer 1000 over the silicon cathode region but not over the dielectric layer 600, leaving non-silicided metal 1002 remaining over the regions not having exposed silicon. Typically, the silicide layer 1000 could be a high barrier height near-noble metal silicide, such as PtSi or $Pd_2Si$, for example. However, the invention may be applicable to any silicide. The high temperature treatment can be done in conventional furnace or in rapid thermal processors or flash and or spike anneal processors. The treatment temperature and time are adjusted as required for different silicidation metals. The ambient used during heat treatment can be neutral, oxidizing or reducing, depending on selection of a particular silicidation metal.

Figure 11:
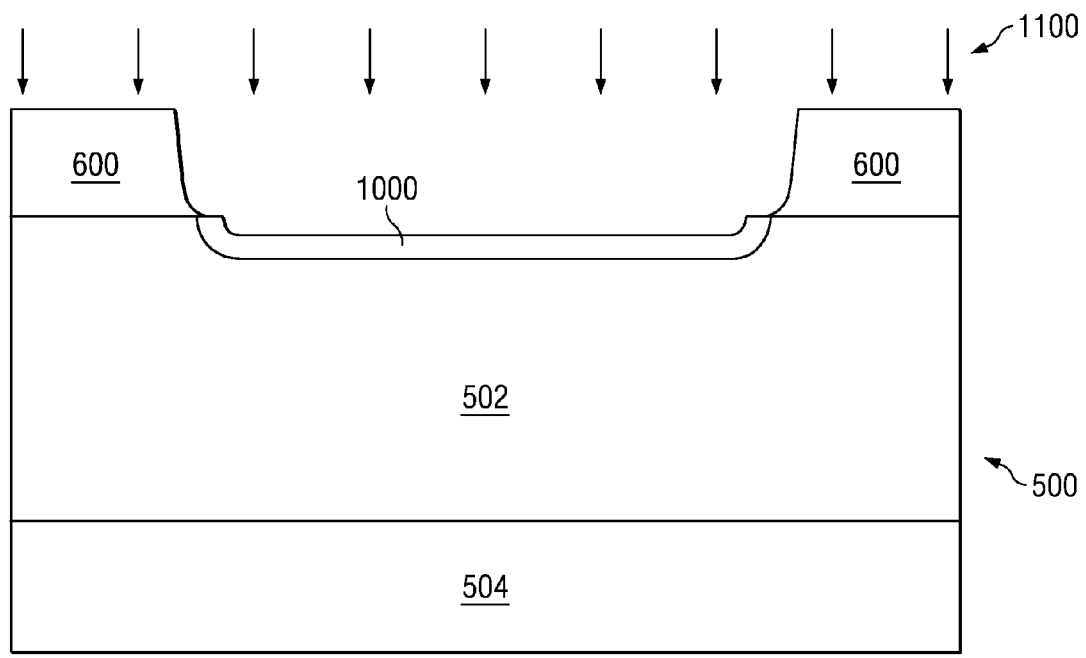

In FIG. 11, an etch 1100 is performed to remove the non-silicided metal 1002, where the etch chemistry depends on the chemical composition of the silicide layer.

Figure 12:
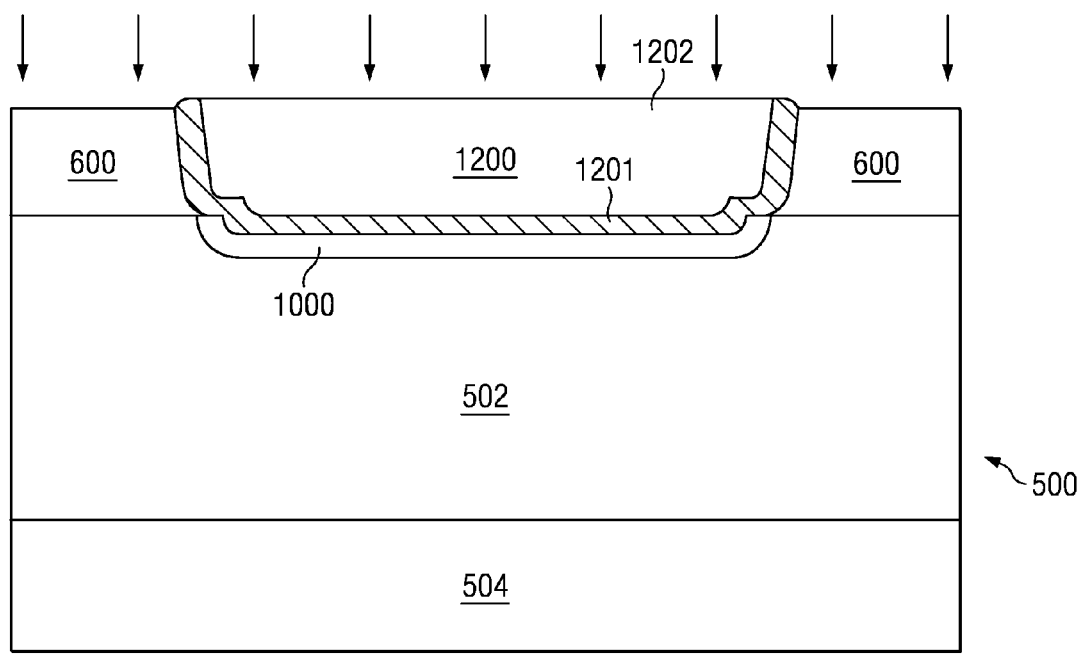

In FIG. 12, a metal 1200 (typically comprised of a diffusion barrier metal and/or adhesion metal layer 1201 and some form of high conductivity filler metal 1202 such as aluminum (Al) or copper (Cu), for example) is deposited to form a contact for the anode. A Ti-based metal or TiN compound or their combination are examples of barrier metals commonly used in the industry.

Those skilled in the art to which the invention relates will appreciate that other embodiments and modifications are possible within the scope of the claimed invention.

What is claimed is:

1. An unguarded Schottky barrier diode comprising:
   a dielectric layer formed over a silicon cathode with a window opening formed in the dielectric layer through which a portion of the silicon cathode is exposed;
   a recessed region formed in the silicon cathode through the window opening having a central portion onto which the window opening opens, and having a peripheral etched undercut portion spaced below the window opening and extending laterally undercutting the dielectric layer;
   a silicide formed in substantial conformity within the recessed region including in the peripheral portion undercutting the dielectric layer; and
   an anode contact formed in electrical communication with the silicide formed within the central portion of the recessed region and separated by an undercut part of the dielectric layer from the silicide formed within the peripheral portion of the recessed region,
   wherein the sidewalls of the window are concave,
   wherein a tail of the dielectric layer which is also concave extends beyond an interface of the dielectric interface and the cathode, and wherein the tail is further sandwiched between the silicide layer and a diffusion metal layer to separate the diffusion metal layer from silicide within the peripheral portion of the recessed region; thereby preventing the formation of a metal-insulator-semiconductor diode,
   wherein no other layers are interposed between the cathode and dielectric layer and the tail of the dielectric layer.

2. The unguarded Schottky barrier diode of claim 1, wherein the dielectric layer comprises a continuous material.

3. The unguarded Schottky barrier diode of claim 1, wherein the sidewalls of the window are substantially vertical.

4. The unguarded Schottky barrier diode of claim 1, wherein the silicide layer has a top silicide surface that is between a recessed surface of the recessed region and the dielectric interface surface.

5. The unguarded Schottky barrier diode of claim 1, further comprising a filler metal that overlies the diffusion barrier layer and fills the window.

6. The unguarded Schottky barrier diode of claim 1, further comprising a highly conductive buried layer over which the cathode extends.

7. The unguarded Schottky barrier diode of claim 1, wherein the silicide layer undercuts the dielectric layer by approximately 10-100 nm.

8. The unguarded Schottky barrier diode of claim 1, wherein the diffusion metal layer conformally overlies the tail of the dielectric layer and the sidewalls of the window.

* * * * *